(12) United States Patent
Cheng et al.

(10) Patent No.: US 8,884,399 B2
(45) Date of Patent: Nov. 11, 2014

(54) INDUCTOR DEVICE AND FABRICATION METHOD

(71) Applicants: Jenhao Cheng, Shanghai (CN); Xining Wang, Shanghai (CN); Ling Liu, Shanghai (CN)

(72) Inventors: Jenhao Cheng, Shanghai (CN); Xining Wang, Shanghai (CN); Ling Liu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 85 days.

(21) Appl. No.: 13/690,378

(22) Filed: Nov. 30, 2012

(65) Prior Publication Data

US 2013/0328164 A1    Dec. 12, 2013

(30) Foreign Application Priority Data

Jun. 6, 2012  (CN) .......................... 2012 1 0184958

(51) Int. Cl.
*H01L 27/08* (2006.01)
*H01L 49/02* (2006.01)
*H01L 23/522* (2006.01)

(52) U.S. Cl.
CPC ............ *H01L 28/10* (2013.01); *H01L 23/5227* (2013.01); *H01L 2924/0002* (2013.01)
USPC ........................................................ 257/531

(58) Field of Classification Search
CPC ...................................................... H01L 28/10
USPC ........................................................... 257/531
See application file for complete search history.

(56) References Cited

U.S. PATENT DOCUMENTS

| | | | | |
|---|---|---|---|---|
| 2,843,829 | A * | 7/1958 | Slate | 336/200 |
| 5,852,866 | A * | 12/1998 | Kuettner et al. | 29/608 |
| 6,194,987 | B1 * | 2/2001 | Zhou et al. | 336/200 |
| 6,864,581 | B1 * | 3/2005 | Hopper et al. | 257/758 |
| 6,894,598 | B2 * | 5/2005 | Heima | 336/200 |
| 7,078,998 | B2 * | 7/2006 | Zhang et al. | 336/200 |
| 7,782,166 | B2 * | 8/2010 | Loke et al. | 336/200 |
| 7,791,165 | B2 * | 9/2010 | Tanaka | 257/531 |
| 2002/0158306 | A1 * | 10/2002 | Niitsu | 257/531 |
| 2004/0140878 | A1 * | 7/2004 | Heima | 336/223 |
| 2006/0234459 | A1 * | 10/2006 | Tani | 438/329 |
| 2011/0156854 | A1 | 6/2011 | Lee | |

* cited by examiner

*Primary Examiner* — Lex Malsawma
(74) *Attorney, Agent, or Firm* — Anova Law Group, PLLC

(57) ABSTRACT

Various embodiments provide inductor devices and fabrication methods. An exemplary inductor device can include a plurality of planar spiral wirings isolated by a dielectric layer. The planar spiral wirings can be connected by conductive pads formed over the dielectric layer and by conductive plugs formed in the dielectric layer. In one embodiment, a third planar spiral wiring can be formed over a second planar spiral wirings that is formed over a first planar spiral wiring. The third planar spiral wiring can be configured in parallel with the first third planar spiral wiring. The second planar spiral wiring can be configured in series with the first and third planar spiral wirings configured in parallel.

18 Claims, 9 Drawing Sheets

INDUCTOR DEVICE AND FABRICATION METHOD

CROSS-REFERENCES TO RELATED APPLICATIONS

This application claims priority to Chinese Patent Application No. CN201210184958.1, filed on Jun. 6, 2012, the entire contents of which are incorporated herein by reference.

FIELD OF THE DISCLOSURE

The present disclosure relates to the field of semiconductor technology and, more particularly, relates to inductor devices and methods of fabricating high-performance inductor devices.

BACKGROUND

In integrated circuits (ICs), such as complementary metal-oxide-semiconductor (CMOS) radio frequency integrated circuit (RFIC), inductors are important circuitry component, whose performance parameters may directly affect the performance of the ICs. Current inductors often include planar spiral inductors made of metal wires disposed on surface of a substrate or a dielectric layer of an IC device. Planar spiral inductors typically have low noise and low power consumption and are easy for device integration with low cost. With downsizing of IC devices, there are challenges on process uniformity and stability.

FIGS. 1-2 depict a conventional inductor device. Specifically, FIG. 2 shows a top view of the inductor device. FIG. 1 shows a cross section along A-A' line of the device shown in FIG. 2.

As shown in FIGS. 1 & 2, the inductor device includes a spiral wiring 102 disposed on a dielectric layer 101. The dielectric layer 101 is disposed on a semiconductor substrate 100. The spiral wiring 102 has three rounds (or turns) of a metal wire with an inner radius R of 45-50 μm. The metal wire has a width W of 8-10 μm. The spiral wiring 102 has one end connected to an input contact point (pad) 103 and the other end connected to an output contact point (pad) 104 for current inputting and outputting of the device.

However, such planar inductor often has a low quality factor, which may affect performance of the planar inductor. Thus, there is a need to provide inductor devices with improved device quality factor and performance.

BRIEF SUMMARY OF THE DISCLOSURE

According to various embodiments, there is provided an inductor device. The inductor device can include a first planar spiral wiring disposed over a semiconductor substrate; a second planar spiral wiring disposed over the first planar spiral wiring; and a third planar spiral wiring disposed over the second planar spiral wiring. Each of the first, the second, and the third planar spiral wirings can include an outer spiral metal wiring and an inner spiral metal wiring. The inner spiral metal wiring can include at least two isolated sub-metal-lines each connecting to the outer spiral metal wiring. One sub-metal-line of the at least two isolated sub-metal-lines in each of the first, the second, and the third planar spiral wirings can be connected to one another, and the outer spiral metal wiring in the first planar spiral wiring can be connected to the outer spiral metal wiring in the third planar spiral wiring such that the first and the third planar spiral wirings are configured in parallel and the second planar spiral wiring is configured in series with the first and the third planar spiral wirings configured in parallel.

According to various embodiments, there is also provided a method for forming an inductor device. In this method, the inductor device can be formed by forming a first planar spiral wiring over a semiconductor substrate; forming a second planar spiral wiring over the first planar spiral wiring; and forming a third planar spiral wiring over the second planar spiral wiring. Each of the first, the second, and the third planar spiral wirings can include an outer spiral metal wiring and an inner spiral metal wiring. The inner spiral metal wiring can include at least two isolated sub-metal-lines each connecting to the outer spiral metal wiring. The one sub-metal-line of the at least two isolated sub-metal-lines in each of the first, the second, and the third planar spiral wirings can be connected to one another, and the outer spiral metal wiring in the first planar spiral wiring can be connected to the outer spiral metal wiring in the third planar spiral wiring such that the first and the third planar spiral wirings are configured in parallel and the second planar spiral wiring is configured in series with the first and the third planar spiral wirings configured in parallel.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Various embodiments provide inductor devices and fabrication methods. An exemplary inductor device can include a plurality of planar spiral wirings (e.g., formed by conductive coils) isolated by a dielectric layer. The planar spiral wirings can be connected by conductive pads formed over the dielectric layer and by conductive plugs formed in the dielectric layer. In one embodiment, a third planar spiral wiring can be formed over a second planar spiral wirings that is formed over a first planar spiral wiring. The third planar spiral wiring can be configured in parallel with the first third planar spiral wiring. The second planar spiral wiring can be configured in series with the first and third planar spiral wirings configured in parallel. Such inductor devices can have high quality factor and high device performance with reduced effective area. IC devices containing such inductor device(s) can thus have high performance and an increased degree of device integration.

The quality factor of an inductor device is the ratio of its inductive reactance to its resistance at a given frequency, and is a measure of its efficiency. The higher the quality factor of the inductor device, the closer it approaches the behavior of an ideal lossless inductor. The quality factor can be affected by, for example, resistance of metal wire in the inductor spiral wiring(s), and/or parasitic capacitance at overlapping areas (e.g., contact areas) between the inductor spiral wire and adjacent components, e.g., a semiconductor substrate, and/or a top or bottom metal layer. The higher resistance (and/or the higher parasitic capacitance), the lower quality factor and the poorer device performance.

To improve the quality factor and device performance, the width of the metal wire may be increased, so that the current density in the metal wire increases, thereby reducing resistance of the metal wire. However, when the width increases, the overlapping area between the metal wire and adjacent components may also be increased. Parasitic capacitance may be increased as well. As disclosed herein, certain approaches may be used to reduce width of the metal wire and to reduce the effective area of the inductor device. In addition, the resistance and parasitic capacitance can be reduced by controlling various configurations of the planar spiral wiring(s) and their sub-metal-lines. For example, the planar spiral wiring(s) can be configured in parallel, in series, and/or in combination of the parallel and series configurations.

Figure 1:
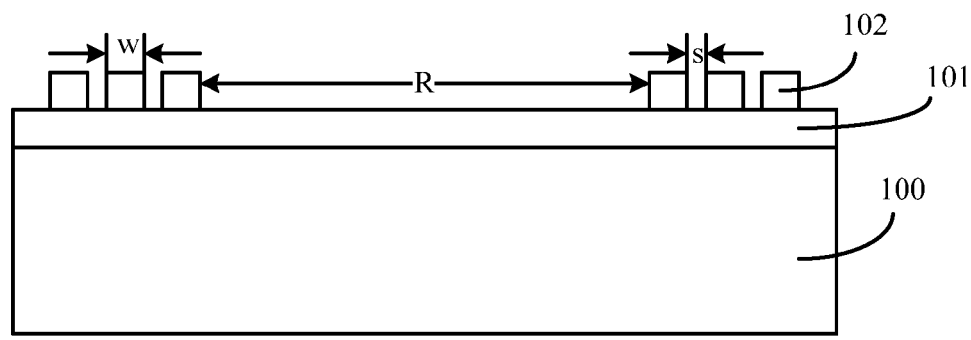
FIGS. 1-2 depict a conventional inductor device.
Figure 2:
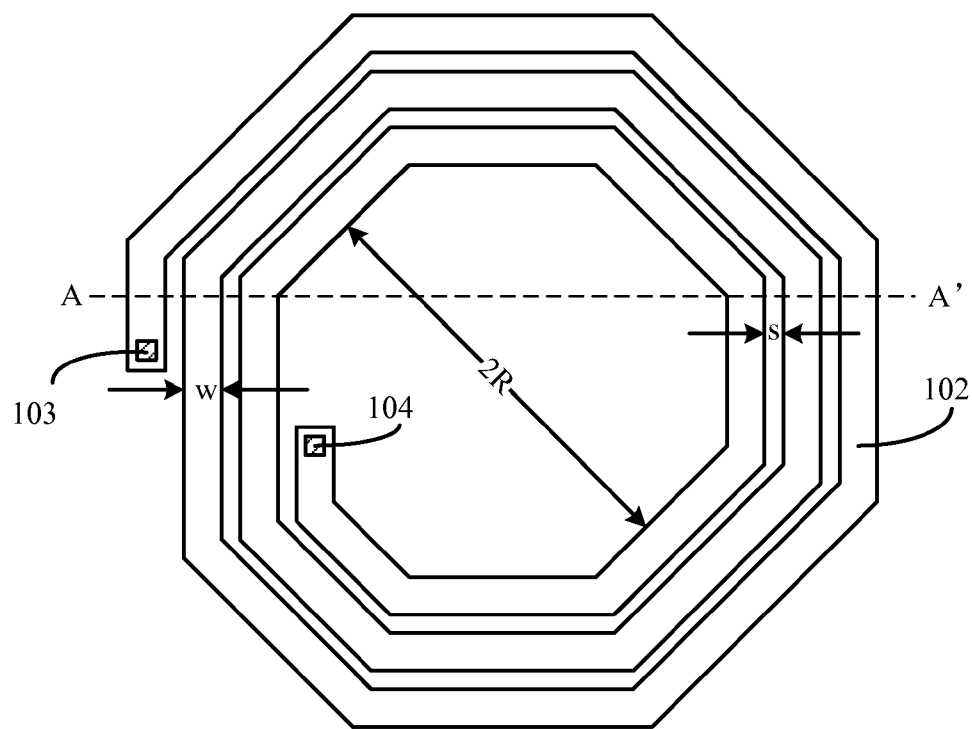
Figure 3:
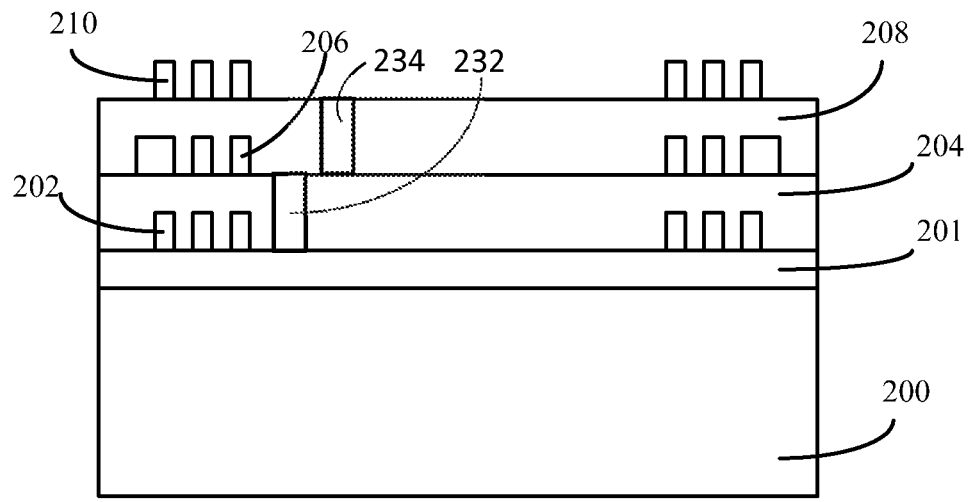
FIG. 3 depicts a cross-sectional view of an exemplary inductor device in accordance with various disclosed embodiments.
Figure 4:
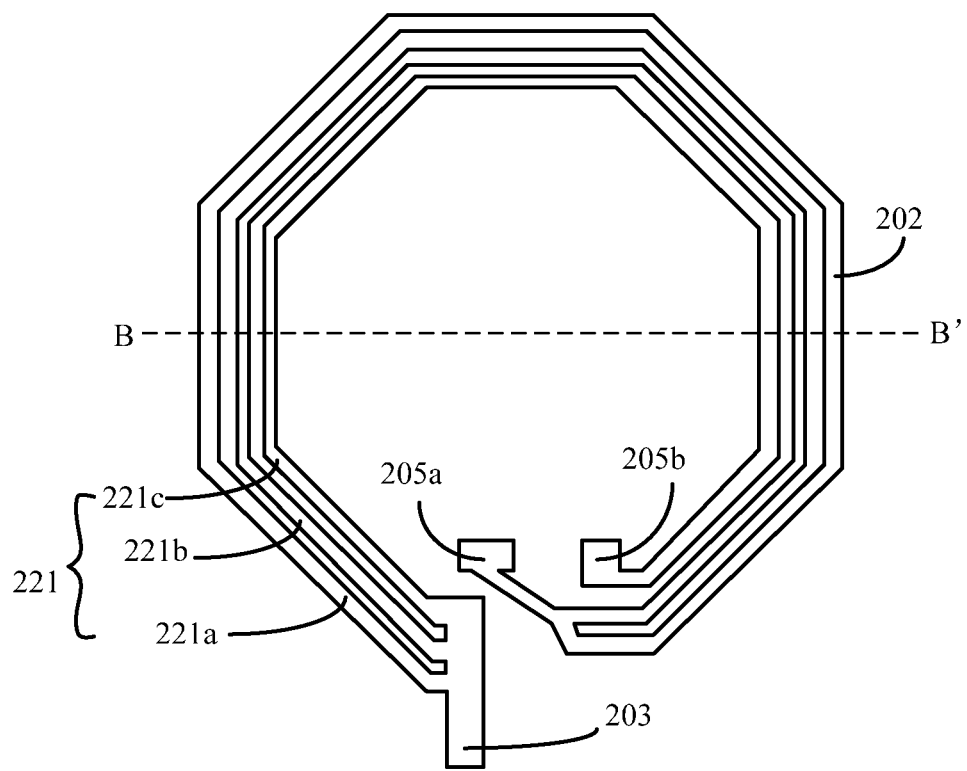
FIG. 4 depicts a top view of a first planar spiral wiring of the exemplary inductor device of FIG. 3 in accordance with various disclosed embodiments.
Figure 5:
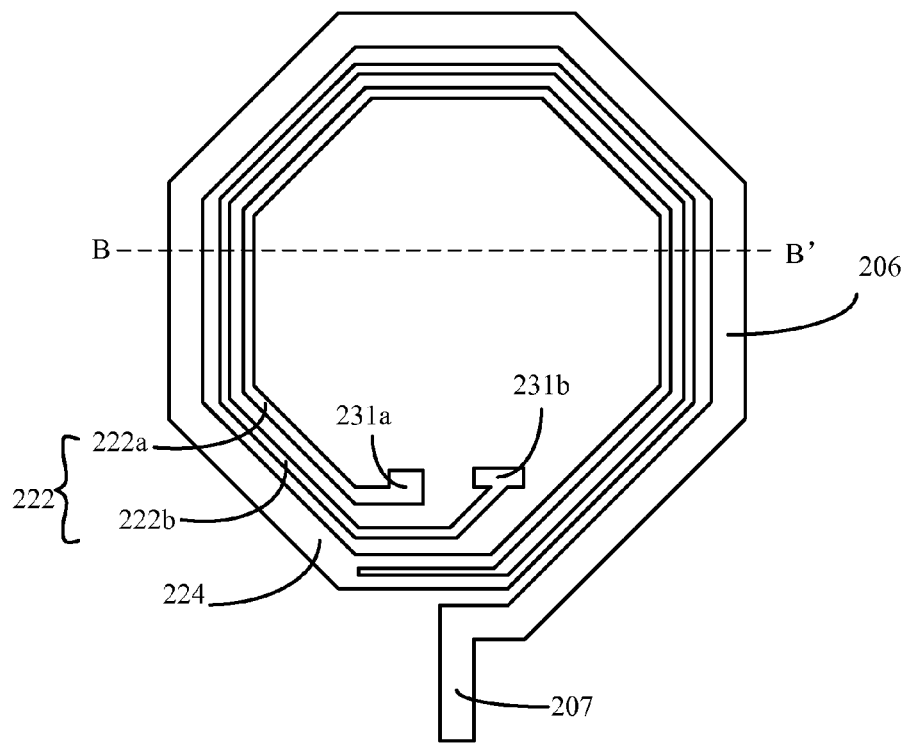
FIG. 5 depicts a top view of a second planar spiral wiring of the exemplary inductor device of FIG. 3 in accordance with various disclosed embodiments.
Figure 6:
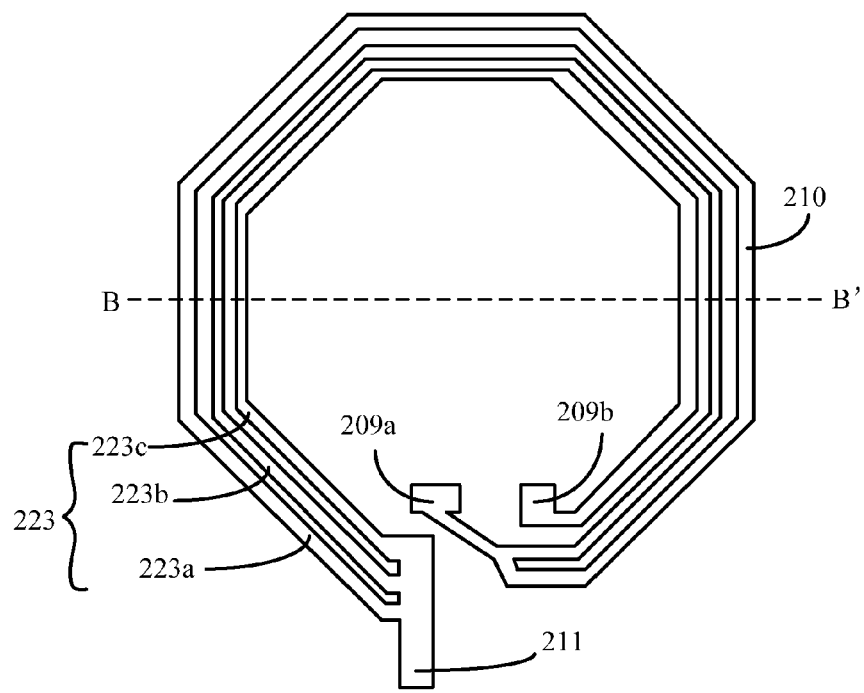
FIG. 6 depicts a top view of a third planar spiral wiring of the exemplary inductor device of FIG. 3 in accordance with various disclosed embodiments.

FIGS. 3-6 depict an exemplary inductor device including, for example, multiple layers of planar spiral wirings. Specifically, FIG. 4 depicts a top view of a first planar spiral wiring; FIG. 5 depicts a top view of a second planar spiral wiring; and FIG. 6 depicts a top view of a third planar spiral wiring of the exemplary inductor device. FIG. 3 depicts a cross-sectional view along B-B' line of the top views depicted in FIGS. 4-6.

The exemplary inductor device depicted in FIGS. 3-6 can include a semiconductor substrate 200; a first dielectric layer 201 disposed over the semiconductor substrate 200; a first planar spiral wiring 202 and a first contact pad 203 disposed over the first dielectric layer 201; a second dielectric layer 204 disposed over the first planar spiral wiring 202; a second planar spiral wiring 206 and a second contact pad 207 disposed over the second dielectric layer 204; a first conductive plug 232 disposed through a thickness of the second dielectric layer 204; a third dielectric layer 208 disposed over the second planar spiral wiring 206; a third planar spiral wiring 210 and a third contact pad 211 disposed over the third dielectric layer 208; and/or a second conductive plug 234 disposed through a thickness of the third dielectric layer 208.

The first planar spiral wiring 202 can include a spiral metal wiring 221. The spiral metal wiring 221 can have a first end connected to the first contact pad 203 and a second end connected to the first conductive plug 232.

The second planar spiral wiring 206 can include an outer spiral metal wiring 224 and an inner spiral metal wiring 222 connected to the outer spiral metal wiring 224. For example, the inner spiral metal wiring 222 can include at least two isolated sub-metal-lines 222a-b jointly connected to the outer spiral metal wiring 224, i.e., sub-metal-lines 222a-b resemble multi-fingers of outer spiral metal wiring 224. The outer spiral metal wiring 224 can further be connected to the second contact pad 207.

The first conductive plug 232 in the second dielectric layer 204 can be connected to the spiral metal wiring 221 of the first planar spiral wiring 202 at a first end, and can be connected to the sub-metal-line 222a of the second planar spiral wiring 206 at a second end.

The third planar spiral wiring 210 can include a spiral metal wiring 223 connected to the third contact pad 211. The spiral metal wiring 223 of the third planar spiral wiring 210 can be connected to the third contact pad 211 at a first end, and can be connected to the second conductive plug 234 at a second end.

The third contact pad 211 of the third planar spiral wiring 210 can be connected to the first contact pad 203 of the first planar spiral wiring 202, e.g., via a third conductive plug. The second conductive plug 234 in the third dielectric layer 208 can have a first end connected to an end of the sub-metal-line 222a, which is also connected to the first conductive plug 232 in the second dielectric layer 204. The second conductive plug 234 in the third dielectric layer 208 can have a second end connected to the spiral metal wiring 223 of the third planar spiral wiring 210.

Because the first conductive plug 232 can be connected to the second conductive plug 234 and the first contact pad 203 can be connected to the third contact pad 211, the first planar spiral wiring 202 and the third planar spiral wiring 210 can be configured in parallel. Resistance of the inductor device can thus be reduced. Quality factor and device performance can be improved. In addition, the sub-metal-lines configured between the device input and device output can be configured in parallel. With reduced width of these sub-metal-lines, resistance of the inductor device can be reduced. Parasitic capacitance can be reduced. Quality factor of the inductor device can be increased. Further, the overlapping configuration of the first planar spiral wiring 202, the second planar spiral wiring 206, and/or the third planar spiral wiring 210 as shown in FIG. 3 can provide the inductor device with reduced effective area at a desired inductance frequency. The reduced effective area can facilitate device integration.

Referring back to FIG. 3, the semiconductor substrate 200 can provide a working platform and can be made of a material including, but not limited to, silicon (Si), silicon germanium (SiGe), silicon carbide (SiC), silicon on insulator (SOI), silicon nitride ($Si_xN_y$), and/or a Group III-V substrate, such as, for example, gallium arsenide (GaAs), indium phosphide (InP), and/or gallium nitride (GaN).

The first dielectric layer 201, the second dielectric layer 204, and/or the third dielectric layer 208 can be made of a material including, e.g., silicon oxide and/or silicon nitride. The first dielectric layer 201 can be used to isolate the first planar spiral wiring 202 from the semiconductor substrate 200. The second dielectric layer 204 can be used to isolate the first planar spiral wiring 202 from the second planar spiral wiring 206. Both the first planar spiral wiring can 202 and the second dielectric layer 204 can be formed on a surface of the first dielectric layer 201. The third dielectric layer 208 can be used to isolate the second planar spiral wiring 206 from the third planar spiral wiring 210. Both the second planar spiral wiring 206 and the third dielectric layer 208 can be formed on a surface of the second dielectric layer 204.

The first planar spiral wiring 202, the second planar spiral wiring 206, or the third planar spiral wiring 210 can include an outer spiral metal wiring and/or an inner spiral metal wiring connected to the outer spiral metal wiring. The outer spiral metal wiring can include about 1-10 isolated sub-metal-lines. The inner spiral metal wiring can include about 2-10 isolated sub-metal-lines. A distance between adjacent sub-metal-lines in each of the first planar spiral wiring 202, the second planar spiral wiring 206, and the third planar spiral wiring 210 can be about 0.001 μm to about 100 μm, in one embodiment, for example, about 1 μm to about 20 μm. The sub-metal-lines can have a width of about 0.1 μm to about 100 μm, for example, about 1 μm to about 20 μm. The first planar spiral wiring 202, the second planar spiral wiring 206, and/or the third planar spiral wiring 210 can have a thickness of about 0.1 μm to about 100 μm, for example, of about 0.1 μm to about 5 μm, and a spiral shape including, for example, a quadrilateral, hexagonal, octagonal, and/or round shape. The first planar spiral wiring 202, the second planar spiral wiring 206, or the third planar spiral wiring 210 can be formed of a material including copper, aluminum, and/or other conductive materials. The first planar spiral wiring 202, the second planar spiral wiring 206, and/or the third planar spiral wiring 210 can have an inner radius of about 5 μm to about 1 m, for example, about 5 μm to about 100 μm.

Referring to FIG. 4, in a certain embodiment, the first planar spiral wiring 202 can be made of copper. The planar spiral wiring 202 can have an octagonal shape and a thickness of about 0.1 μm to about 100 μm, for example, about 0.9 μm. The first planar spiral wiring 202 can have an inner radius of, e.g., about 25 μm to about 30 μm. The first planar spiral wiring 202 can include the spiral metal wiring 221 having sub-metal-lines 221a, 221b, and 221c. The sub-metal-lines 221a, 221b, and/or 221c can have a width of about 0.1 μm to about 100 μm, for example, about 3 μm. The sub-metal-line 221a, 221b, and/or 221c can have a reduced width. Accordingly, parasitic capacitance generated in these sub-metal-lines can be reduced to improve quality factor.

As shown in FIG. 4, in planar layer of the planar spiral wiring 202, sub-metal-lines 221a-b (or 221a) are configured as an outer spiral metal wiring surrounding the sub-metal-line 221c (or 221b-c) as an inner spiral metal wiring. The inner spiral metal wiring has the above-discussed inner radius.

In other embodiments, the first planar spiral wiring 202 can include an inner spiral metal wiring connected to an outer spiral metal wiring. The inner spiral metal wiring can include at least two isolated sub-metal-lines.

Referring to FIG. 5, in a certain embodiment, the second planar spiral wiring 206 can be made of copper. The planar spiral wiring 206 can have an octagonal shape and a thickness of about 0.1 μm to about 100 μm, for example, about 3 μm to about 4 μm. The second planar spiral wiring 202 can include an outer spiral metal wiring 224 and an inner spiral metal wiring 222 connected to the outer spiral metal wiring 224. The second planar spiral wiring 206 can have an inner radius, e.g., formed by the inner sub-metal-line 222a ranging from, e.g., about 25 μm to about 30 μm.

The inner spiral metal wiring 222 of the second planar spiral wiring 206 can include isolated sub-metal-lines 222a-b. The isolated sub-metal-lines 222a-b can have a width, e.g., of about 3 μm. The sub-metal-lines 222a-b can be commonly connected to the outer spiral metal wiring 224 at a first end, while a second end of the sub-metal-line 222a can be connected to a second contact point 231a, and a second end of the sub-metal-line 222b can be connected to a second contact point 231b. Because the sub-metal-lines 222a-b have a reduced width, parasitic capacitance generated in the sub-metal-lines 222a-b can be reduced. Device quality factor can thus be improved.

In an exemplary embodiment, the outer spiral metal wiring 224 can be made of a single wire. The outer spiral metal wiring 224 can have a width greater than the sub-metal-lines 222a-b. The sub-metal-line 222a, the sub-metal-line 222b, and the outer spiral metal wiring 224 can be spaced apart having a distance of about 0.001 μm to about 100 μm, for example, about 3 μm. The outer spiral metal wiring 224 can further be connected to the second contact pad 207. In one embodiment, the second planar spiral wiring 206 can be made of copper and/or have a reduced thickness in the range of about 0.1 μm to about 100 μm, for example, about 3 μm to about 4 μm. The second planar spiral wiring 206 can thus have a low resistance. In addition, the outer spiral metal wiring 224 made by a single wire can have an increased width, current density and drive current in the outer spiral metal wiring 224 can thus be increased. The resistance can be reduced. At least for these reasons, quality factor of the second planar spiral wiring 206 can be improved.

As shown in FIG. 5, in planar layer of the planar spiral wiring 206, the outer spiral metal wiring 224 can surround the second spiral metal wiring 222 (including the sub-metal-lines 222a-b) as an inner spiral metal wiring having the above-discussed inner radius.

In operation, current crowding effect may accumulate carriers in the inner spiral wiring 222 of the inductor device due to electromagnetic attraction. Because the inner spiral metal wiring 222 is configured including parallel sub-metal-lines 222a-222b, current flowing therein can be divided. Resistance of the inner spiral metal wiring 222 can be reduced. Device quality factor can be increased.

The inner sub-metal-line 221c of the first planar spiral wiring 202 can be connected to the sub-metal-line 222b of the second planar spiral wiring 206 via the first conductive plug 232, while the inner sub-metal-line 222a of the second planar spiral wiring 206 can be connected to the outer sub-metal-line 221a and the sub-metal-line 221b of the first planar spiral wiring 202 via the first conductive plug 232. Carriers accumulated in the inner wiring can then be dispersed. Resistance can be reduced and device quality factor can be increased.

In other embodiments, the first conductive plug 232 disposed through the second dielectric layer 204 can connect the first contact point 205a with the second contact point 231b and can connect the first contact point 205b with the second contact point 231a. The sub-metal-lines 221a-b configured in parallel can be connected to the sub-metal-line 222b. The sub-metal-line 221c can be connected to the sub-metal-line 222a.

Referring to FIG. 6, in various embodiments, the third planar spiral wiring 210 can be made of copper and have an octagonal shape. The third planar spiral wiring 210 can have a thickness of about 0.1 μm to about 100 μm, for example, about 1.4 μm to about 3 μm. The third planar spiral wiring 210 can include a single round of the spiral metal wiring 223, e.g., including the sub-metal-lines 223a-c. The third planar spiral wiring 210 can have an inner radius, e.g., ranging from about 25 μm to about 30 μm formed by the innermost sub-metal-line 223c.

The third planar spiral wiring 210 can include isolated sub-metal-lines 223a, 223b, and 223c. The sub-metal-line 223a, 223b, or 223c may have a reduced width of about 0.1 μm to about 100 μm, for example, about 3 μm such that parasitic capacitance generated in the sub-metal-line 223a, 223b, or 223c can be reduced to improve device quality factor. The sub-metal-lines 223a, 223b, and 223c can be commonly connected to the third contact pad 211 at a first end, while a second end of the sub-metal-lines 223a-223b can be connected to the third contact point 209a, and a second end of the sub-metal-line 223c can be connected to the third contact point 209b. The second contact point 231a can be connected to the third contact point 209a via the second conductive plug 234 in the third dielectric layer 208. The second contact point 231b can be connected to the third contact point 209b via the second conductive plug 234. Such configurations can facilitate to alleviate resistance increasing due to carrier accumulation in the sub-metal-lines of the metal wirings.

In certain embodiments, sub-metal-lines can be configured in parallel between device input and output such that resistance in the inductor device can be reduced to improve quality factor. In addition, the first contact pad 203 can be connected to the third contact pad 211. The first conductive plug 232 can be connected to the second conductive plug 234. Thus, the first planar spiral wiring 202 and the third planar spiral wiring 210 are configured in parallel, which reduces resistance in the inductor device and improves device quality factor.

Further, the second planar spiral wiring 206 can be configured in series with the first and third planar spiral wirings configured in parallel. Note that although the second planar spiral wiring 206 is configured in series, it can be stacked over the first planar spiral wirings 202 and the third planar spiral wirings 210 can be stacked over the second planar spiral wiring 206 such that an overlapping structure/configuration can be provided as shown in FIG. 3. The resulting inductor device can thus have a reduced effective area and an increased inductance per area. In one example, the disclosed inductor device can save more than about 50% effective area and/or can gain more than about 25% Q (i.e., quality factor) performance enhancement as compared with other inductor devices that do not have the disclosed overlapping (or stacked) configuration but operated in a similar inductance range. In a certain example, the inductor area may be about 70×70 μm$^2$ or less.

It should be noted that when the quality factor of the first planar spiral wiring 202, the quality factor of the second planar spiral wiring 206, and the quality factor of the third planar spiral wiring 210 are at a comparable level, e.g., with a difference at a range of approximately 1-5, the inductor device, formed by the first planar spiral wiring 202, the second planar spiral wiring 206, and the third planar spiral wiring 210 configured in series, in parallel, or their combinations, can have high quality factor and high device performance.

In various embodiments, quality factor of the inductor device can be controlled by controlling, e.g., the number, dimensions (e.g., width, thickness, etc.), and/or material used for the sub-metal-lines of the first planar spiral wiring 202, the second planar spiral wiring 206, and/or the third planar spiral wiring 210. Specifically, when increasing the width of sub-metal-line(s) in the planar spiral wiring(s) and/or increasing number of the isolated sub-metal-line(s), quality factor of the planar spiral wiring(s) can be increased. For example, the width and/or the configuration of the sub-metal-lines (e.g., resembling coil fingers) of the first, second, and/or third planar spiral wirings can be tuned to provide desired device performance.

Figure 7:
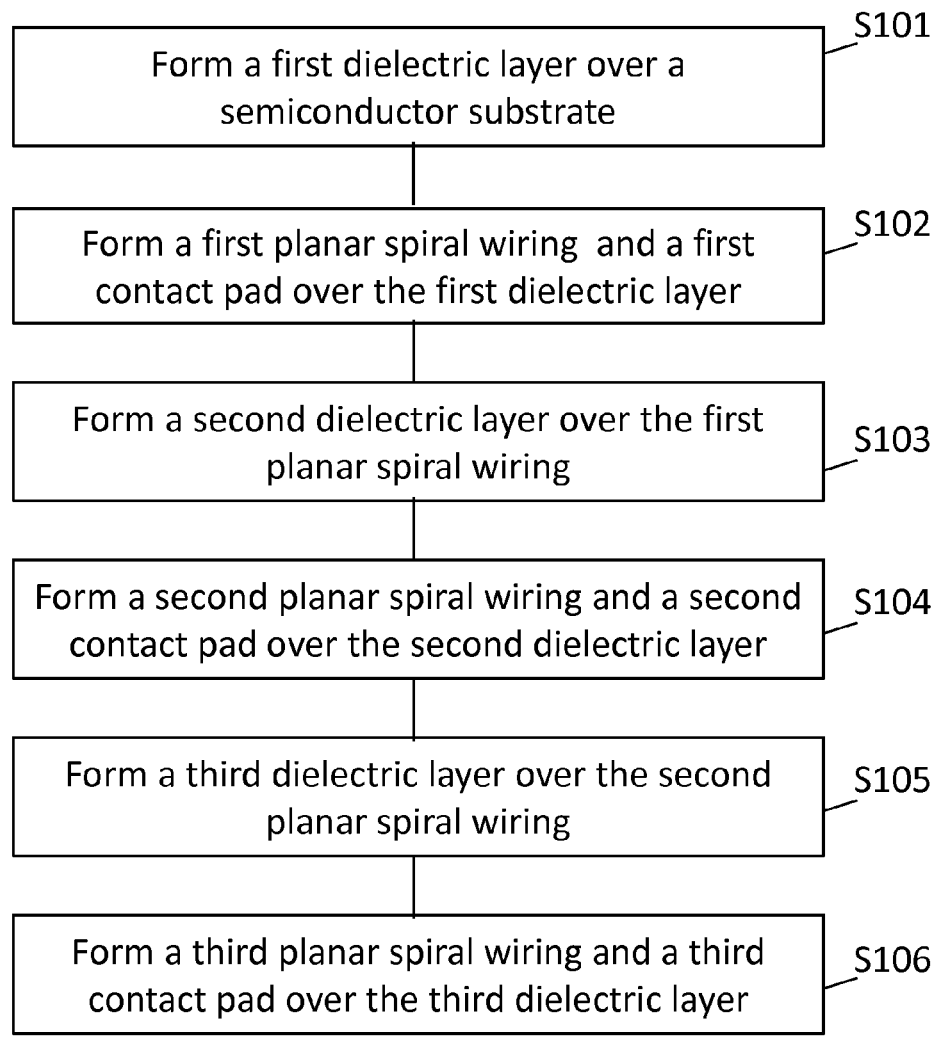
FIG. 7 depicts an exemplary method for making an inductor device in accordance with various disclosed embodiments.

FIG. 7 depicts an exemplary method for forming an exemplary inductor device, e.g., the device as shown in FIGS. 3-6. FIGS. 8-9, 11-12, and 14-15 depict a cross-sectional view of the inductor device at various stages during its formation as depicted in FIG. 7.

Figure 8:
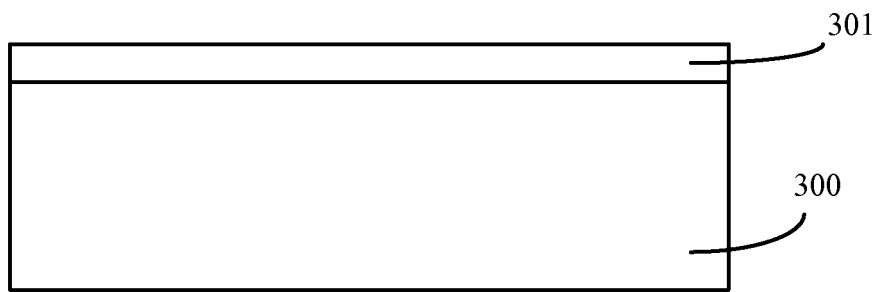
FIGS. 8-9, 11-12, and 14-15 depict a cross-sectional view of the exemplary inductor device at various stages during the formation as depicted in FIG. 7 in accordance with various disclosed embodiments.

Referring to step S101 in FIG. 7, a semiconductor substrate can be provided. A first dielectric layer can be formed on the semiconductor substrate. FIG. 8 depicts a corresponding structure.

Referring to FIG. 8, a first dielectric layer 301 can be formed on a semiconductor substrate 300. The semiconductor substrate 300 can provide a working platform and can be made of a material including, but not limited to, silicon (Si), silicon germanium (SiGe), silicon carbide (SiC), silicon on insulator (SOI), silicon nitride ($Si_xN_y$) and/or a Group III-V substrate, such as, for example, gallium arsenide (GaAs), indium phosphide (InP), and/or gallium nitride (GaN).

The first dielectric layer 301 can be made of a material including, e.g., silicon oxide, silicon nitride, and/or other dielectric materials. The first dielectric layer 301 can be used to isolate a subsequently-formed first planar spiral wiring from the semiconductor substrate 300. The first dielectric layer 301 can be formed by, e.g., chemical vapor deposition.

In some cases, a dummy metal layer may be formed over the semiconductor substrate 300 for temporal protection and then removed after formation of the inductor device to facilitate stable operation of the inductor device. However, parasitic capacitance can be formed between the dummy metal layer and the subsequently-formed planar spiral wiring, which reduces quality factor of the device. As disclosed herein, there is no need to form the dummy metal layer before forming the dielectric layer 301 due to the reduced effective area of the disclosed inductor device. For example, by overlapping the first planar spiral wiring, the second planar spiral wiring, and the third planar spiral wiring as shown in FIG. 3, the inductor device can have reduced effective area without sacrificing a total length of the metal wiring. The reduced effective area can allow for elimination of forming the dummy metal layer on the substrate prior to forming the dielectric layer 301. The surface uniformity of the semiconductor substrate 300 can be provided by a planarization process, e.g., a chemical mechanical planarization, prior to forming the first dielectric layer 301. Quality factor of the inductor device can at least be maintained.

Referring to step S102 in FIG. 7, a first planar spiral wiring and/or a first contact pad can be formed on the first dielectric layer. The first planar spiral wiring can include an outer spiral metal wiring and an inner spiral metal wiring connected to the outer spiral metal wiring. The inner spiral metal wiring can include at least two isolated sub-metal-lines. While a first end of the outer spiral metal wiring can be connected to the sub-metal-lines of the inner spiral metal wiring, a second end of the outer spiral metal wiring can be connected to the first contact pad.

Figure 9:
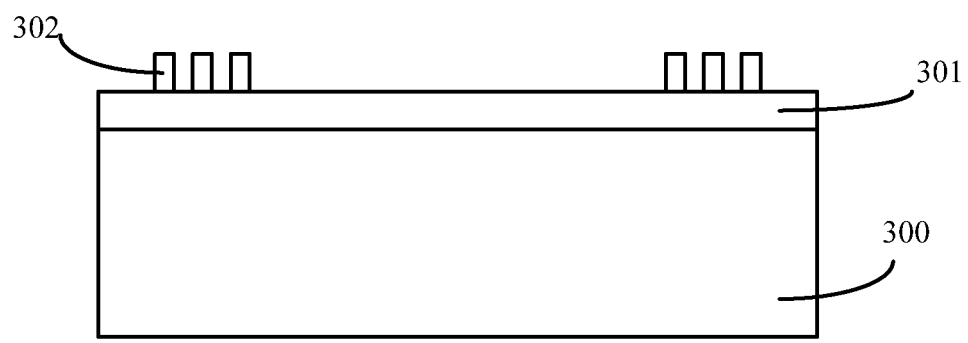
Figure 10:
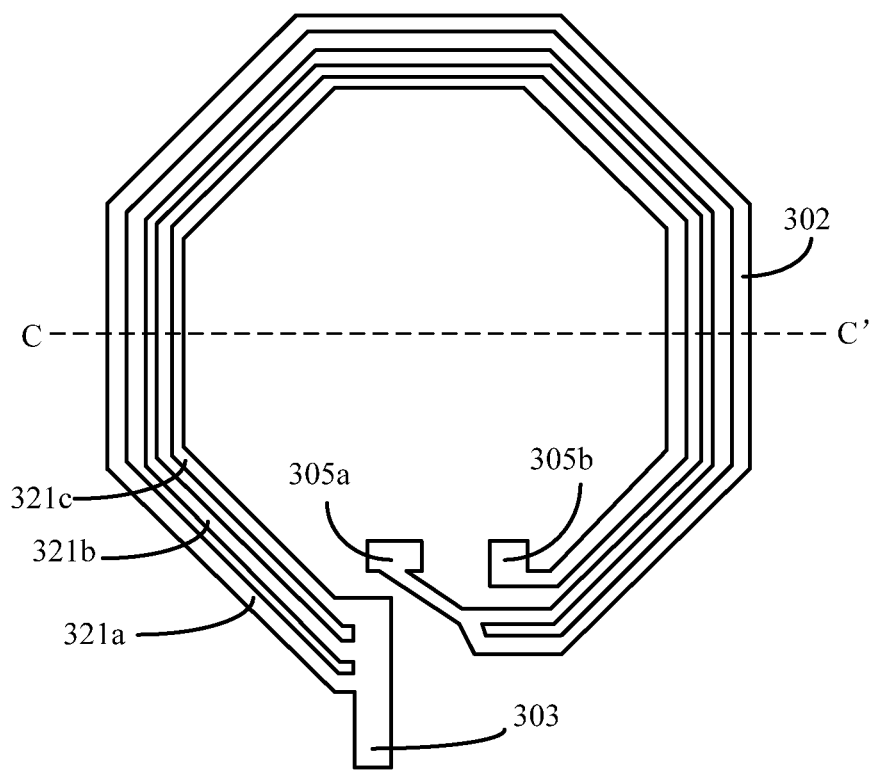
FIG. 10 depicts a top view of a first planar spiral wiring of the inductor device shown in FIG. 9 in accordance with various disclosed embodiments.

Corresponding structures are depicted in FIGS. 9-10. Specifically, FIG. 10 depicts a top view of a first planar spiral wiring of the inductor device shown in FIG. 9. FIG. 9 depicts a cross-sectional view along C-C' line of FIG. 10.

Referring to FIGS. 9-10, a first planar spiral wiring 302 can be formed on the first dielectric layer 301. The first planar spiral wiring 302 can include, for example, a single spiral metal wiring, which is also referred herein as either an "outer spiral metal wiring" or an "an inner spiral metal wiring" for illustration purposes in this certain embodiment. The outer spiral metal wiring can include isolated sub-metal-lines 321a, 321b, and 321c. The sub-metal-lines 321a, 321b, and 321c can be connected to the first contact pad 303.

In a certain embodiment, the first planar spiral wiring 302 can be made of copper and have an octagonal shape. The first planar spiral wiring 302 can have a thickness of about 0.1 μm to about 100 μm, for example, about 0.9 μm. The first planar spiral wiring 302 can have an inner radius, e.g., ranging from about 25 μm to about 30 μm formed by the innermost sub-metal-line 321c.

The first planar spiral wiring 302 can be formed by, e.g., standard photolithography. In one example, the first planar spiral wiring 302 can be formed by first forming (e.g., depositing) a metal layer (not illustrated) on the first dielectric layer 301; then forming a photoresist layer (not illustrated) on the metal layer to define a corresponding position of the first planar spiral wiring 302 to be formed; and then using the photoresist layer as a mask to etch the metal layer to form the first planar spiral wiring 302.

The first planar spiral wiring 302 can be formed by isolated sub-metal-lines 321a, 321b, and 321c. The sub-metal-lines 321a, 321b, and 321c can have a reduced width of about 0.1 μm to about 100 μm, for example, about 3 μm. Due to the reduced width, parasitic capacitance of the sub-metal-lines 321a, 321b, and 321c can be reduced. While a first end of the sub-metal-lines 321a, 321b, and 321c can be commonly connected to the first contact pad 303, a second end of the sub-metal-lines 321a-321b can be connected to the first contact point 305a, and a second end of the sub-metal-line 321c can be connected to the first contact point 305b, as shown in FIG. 10.

Referring to step S103 in FIG. 7, a second dielectric layer can be formed on the first planar spiral wiring. A first conductive plug can be formed through the second dielectric layer and connected to the inner spiral metal wiring of the first planar spiral wiring. A corresponding structure is shown in FIG. 11.

Figure 11:
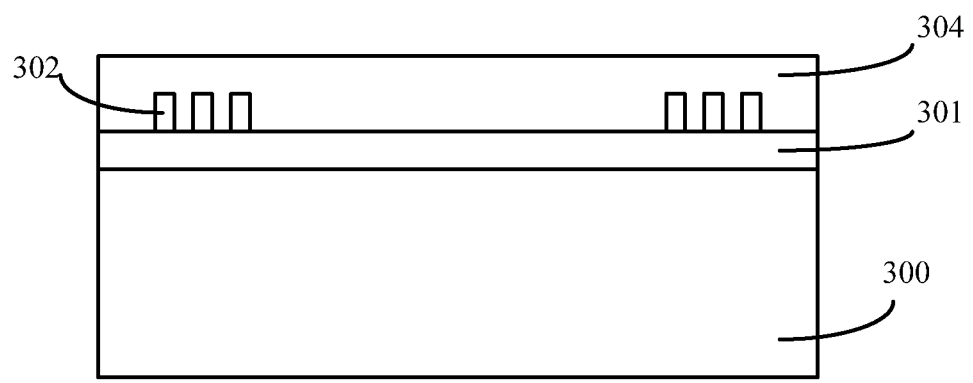

Referring to FIG. 11, a second dielectric layer 304 can be formed on the first planar spiral wiring 302. A first conductive plug (not illustrated) can be formed in the second dielectric layer 304. The first conductive plug can be connected to the first planar spiral wiring 302.

In a certain embodiment, the second dielectric layer 304 can be formed by similar materials and methods as for forming the first dielectric layer 301. The bottom surface of the second dielectric layer 304 can flush with the bottom surface of the first planar spiral wiring 302. The second dielectric layer 304 can be used to isolate the first planar spiral wiring 302 from the subsequently-formed second planar spiral wiring.

The first conductive plug (not illustrated) can be formed by a process including, for example, forming an opening through an entire thickness of the second dielectric layer 304 to expose a surface of the first contact pad 305a and to expose a surface of the first contact pad 305b; filling metal in the through-opening; and planarizing a top surface including the filled metal and the second dielectric layer 304.

Referring to step S104 in FIG. 7, a second planar spiral wiring and a second contact pad can be formed on the second dielectric layer. The second planar spiral wiring can include an outer spiral metal wiring and an inner spiral metal wiring connected to the outer spiral metal wiring. The inner spiral metal wiring can include at least two isolated sub-metal-lines. A first end of the at least two isolated sub-metal-lines can be connected to the outer spiral metal wiring, while a second end of the at least two sub-metal-lines can be connected to the first conductive plug. The outer spiral metal wiring can further be connected to the second contact pad.

Figure 12:
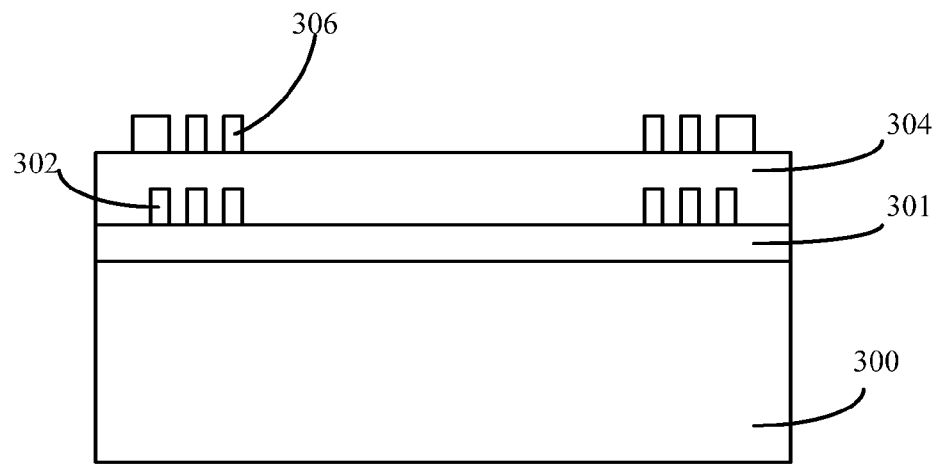
Figure 13:
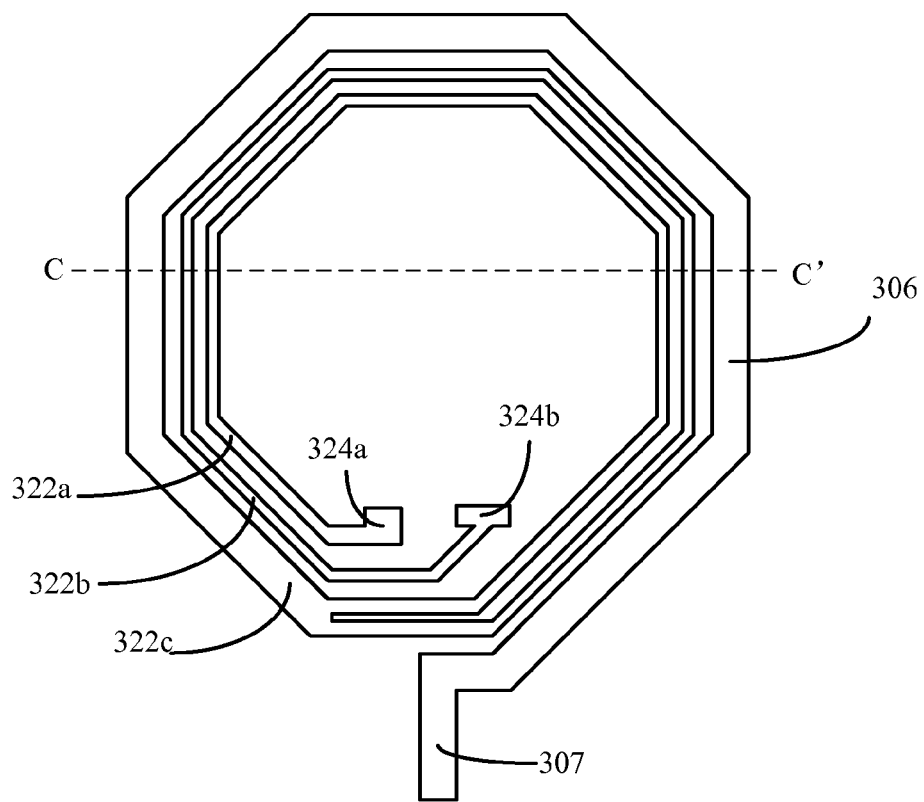
FIG. 13 depicts a top view of a second planar spiral wiring of the inductor device shown in FIG. 12 in accordance with various disclosed embodiments.

Corresponding structures are shown in FIGS. 12-13. Specifically, FIG. 13 depicts a top view of a second planar spiral wiring of the inductor device shown in FIG. 12. FIG. 12 depicts a cross-sectional view along C-C' line of FIG. 13.

Referring to FIGS. 12-13, a second planar spiral wiring 306 can be formed on the second dielectric layer 304. The second planar spiral wiring 306 can include an outer spiral metal wiring 322c and an inner spiral metal wiring connected to the outer spiral metal wiring 322c. The inner spiral metal wiring can include isolated sub-metal-lines 322a-322b. While the sub-metal-lines 322a-322b can be commonly connected to the outer spiral metal wiring 322c at a first end, a second end of the sub-metal-line 322a can be connected to the second contact point 324a and a second end of the sub-metal-line 322b can be connected to the second contact point 324b. The outer spiral metal wiring 322c can further be connected to the second contact pad 307.

The second planar spiral wiring 306 can be formed by a similar process for forming the first planar spiral wiring 302. In a certain embodiment, the second planar spiral wiring 306 can be made of copper. The second planar spiral wiring 306 can have an octagonal shape and a thickness of about 0.1 μm to about 100 μm, for example, about 3 μm to 4 μm. The second planar spiral wiring 306 can have an inner radius, e.g., of about 25 μm to about 30 μm formed by the innermost sub-metal-line.

The inner spiral metal wiring of the second planar spiral wiring 306 can include isolated sub-metal-lines 322a-322b, as shown in FIG. 13. The sub-metal-lines 322a-322b can have a reduced width of about 0.1 μm to about 100 μm, for example, about 3 μm. Such reduced width can provide the sub-metal-lines 322a-322b with reduced parasitic capacitance to improve device quality factor. Via the first conductive plug, the second contact point 324a can be connected to the first contact point 305a and the second contact point 324b can be connected to the first contact point 305b.

The outer spiral metal wiring 322c can be made of a single wire. The outer spiral metal wiring 322c can have a width greater than the sub-metal-lines 322a and 322b. In certain embodiments, the outer spiral metal wiring 322c can be a sub-metal-line. A distance between adjacent metal lines of the sub-metal-lines 322a, 322b, and 322c can be about 0.001 μm to about 100 μm, for example, about 3 μm.

Referring to step S105 in FIG. 7, a third dielectric layer can be formed on the second planar spiral wiring. A second conductive plug can be formed in the third dielectric layer. The second conductive plug can be connected to the inner sub-metal-line(s) of the second planar spiral wiring. The inner sub-metal-line(s) can be connected to the first conductive plug in the second dielectric layer. A corresponding structure is shown in FIG. 14.

Figure 14:
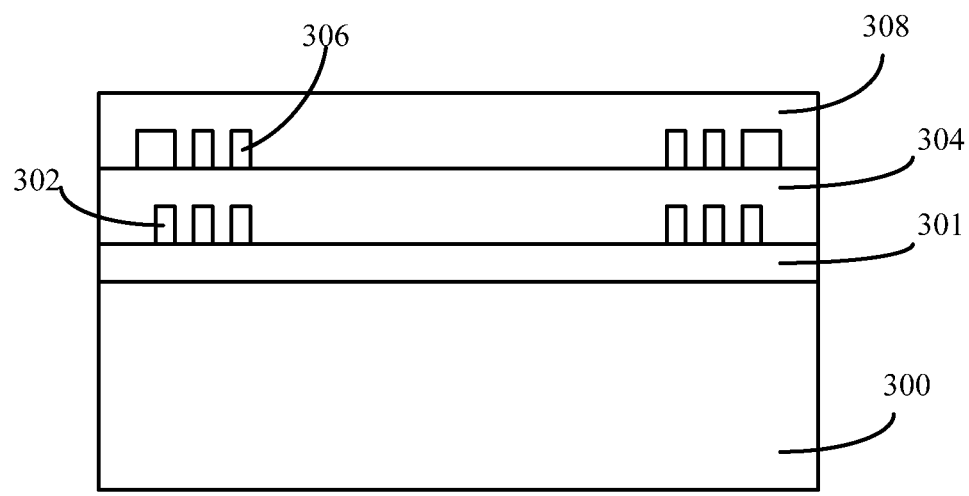

Referring to FIG. 14, a third dielectric layer 308 can be formed on the second planar spiral wiring 306. A second conductive plug (not illustrated) can be formed in the third dielectric layer 308. The second conductive plug can have a first end connected to the second contact points 309a and 309b, and a second end connected to the first conductive plug and the sub-metal-lines 322a-322b of the second planar spiral wiring 306.

The third dielectric layer 308 can be formed using similar materials and methods as for forming the second dielectric layer 304. The second conductive plug can be formed using similar materials and methods as for forming the first conductive plug.

Referring to step S106 in FIG. 7, a third planar spiral wiring and a third contact pad can be formed on the third dielectric layer. The third planar spiral wiring can include an outer spiral metal wiring and an inner spiral metal wiring connected to the outer spiral metal wiring. The inner spiral metal wiring can include at least two isolated sub-metal-lines. While a first end of the at least two sub-metal-lines can be connected to the outer spiral metal wiring, a second end of the sub-metal-lines can be connected to the second conductive plug. The outer spiral metal wiring can further be connected to the third contact pad. The third contact pad can be connected to the first contact pad, e.g., via a third conductive plug.

Figure 15:
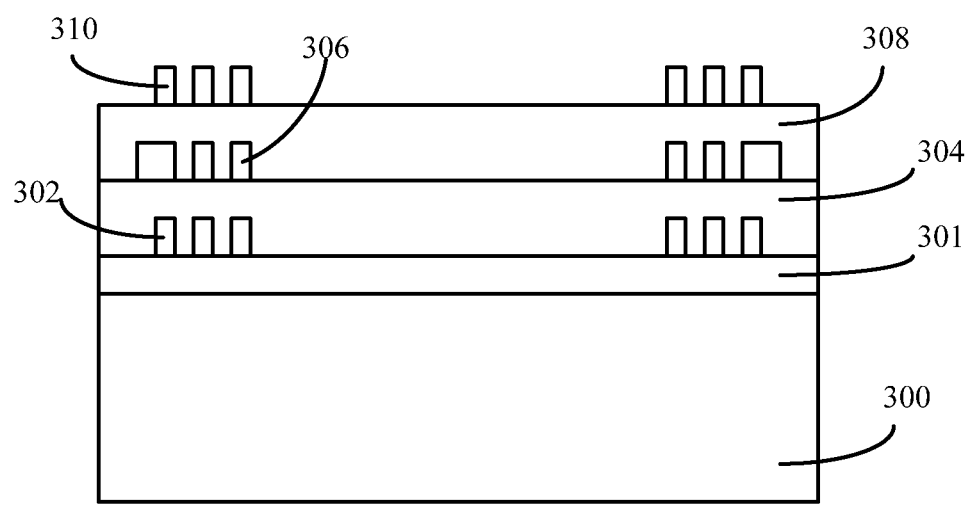
Figure 16:
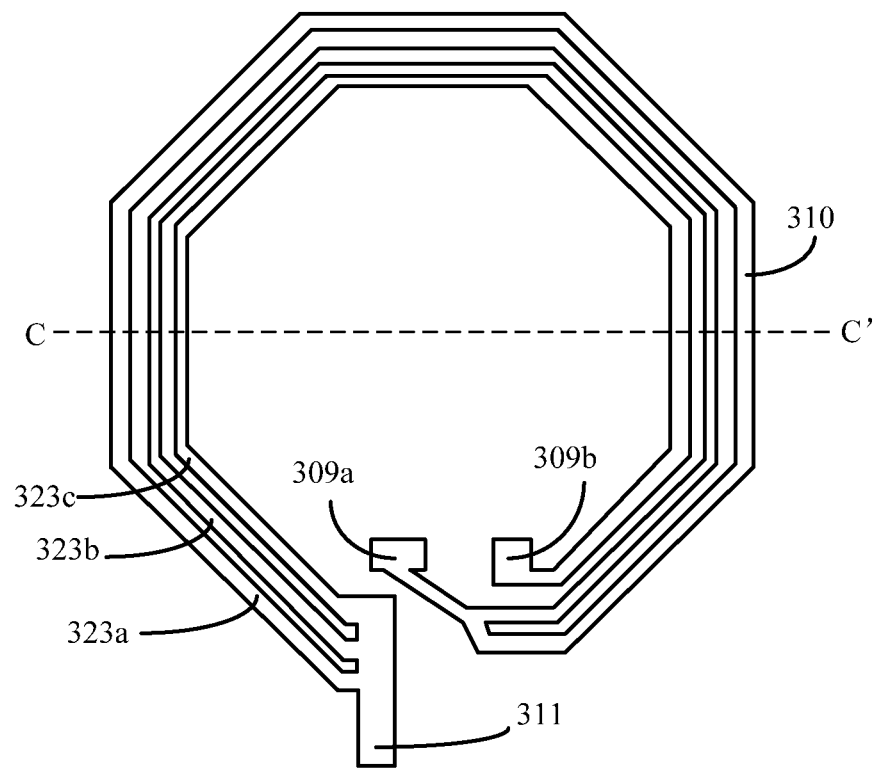
FIG. 16 depicts a top view of a third planar spiral wiring of the inductor device shown in FIG. 15 in accordance with various disclosed embodiments.

Corresponding structures are depicted in FIGS. 15-16. Specifically, FIG. 16 depicts a top view of a third planar spiral wiring of the inductor device shown in FIG. 15. FIG. 15 depicts a cross-sectional view along C-C' line of FIG. 16.

Referring to FIGS. 15-16, a third planar spiral wiring 310 and a third contact pad 311 can be formed on the third dielectric layer 308. The third planar spiral wiring 310 can include an outer spiral metal wiring. The outer spiral metal wiring can include isolated sub-metal-lines 323a, 323b, and 323c. While the sub-metal-lines 323a, 323b, and 323c can be commonly connected to the third contact pad 311, the sub-metal-lines 323a-323b can further be connected to the third contact point 309a, and the sub-metal-line 323c can further be connected to the third contact point 309b. The third contact pad 311 can be connected to the first contact pad 303, e.g., via a third conductive plug.

The third planar spiral wiring 310 can be formed using similar materials and methods as for forming the first planar spiral wiring 302. In one embodiment, the third planar spiral wiring 310 can be made of copper and have an octagonal shape. The third planar spiral wiring 310 can have a thickness of about 0.1 μm to about 100 μm, for example, about 1.4 μm to about 3 μm. The third planar spiral wiring 310 can have an inner radius, e.g., ranging from about 25 μm to about 30 μm. The sub-metal-lines 323a, 323b, and 323c can have a reduced width of about 0.1 μm to about 100 μm, for example, about 3 μm to provide a reduced parasitic capacitance to improve device quality factor.

In this manner, various disclosed embodiments provide inductor devices and fabrication methods. In one embodiment, the inductor device can include a first, second, and third planar spiral wirings. The first planar spiral wiring and the third planar spiral wiring can be configured in parallel and then in series with the second planar spiral wiring. This configuration can reduce the resistance of the inductor device to improve device quality factor, and the first planar spiral wiring can provide a shielding function to eliminate the coupling capacitance between the metal wirings of the inductor device and the semiconductor substrate. In addition, the first planar spiral wiring, the second planar spiral wiring, and/or the third planar spiral wiring can include a plurality of isolated sub-metal-lines, such that the sub-metal-lines configured between the device input and output are configured in parallel. Resistance of the inductor device can be reduced to improve quality factor. Further, while the width of the sub-metal-line(s) is reduced, the parasitic capacitance of the inductor device is reduced, device quality factor and performance is then improved. Furthermore, the overlapping configuration of the first planar spiral wiring, the second planar spiral wiring, and the third planar spiral wiring allows the inductor device to have a reduced effective area. Without sacrificing a total length of the metal wiring(s) of the inductor device, the inductor device can be operated at desired inductance frequency. Even further, quality factor of the inductor device can be controlled by controlling, e.g., the number, dimensions (e.g., width, thickness, etc.), and/or material(s) used for the isolated sub-metal-line(s) of the first planar spiral wiring, the second planar spiral wiring, and/or the third planar spiral wiring.

Other applications, advantages, alternations, modifications, or equivalents to the disclosed embodiments are obvious to those skilled in the art.

What is claimed is:

1. An inductor device comprising:
   a semiconductor substrate;
   a first planar spiral wiring disposed over the semiconductor substrate;
   a second planar spiral wiring disposed over the first planar spiral wiring; and
   a third planar spiral wiring disposed over the second planar spiral wiring,
   wherein each planar layer of the first, the second, and the third planar spiral wirings includes an outer spiral metal wiring and, an inner spiral metal wiring including at least two isolated sub-metal-lines each connecting to the outer spiral metal wiring such that the outer spiral metal wiring and the inner spiral metal wiring are connected in series in each corresponding planar layer, and the outer spiral metal wiring surrounds the inner spiral metal wiring in each corresponding planar layer, and
   wherein one sub-metal-line of the at least two isolated sub-metal-lines in each planar layer of the first, the second, and the third planar spiral wirings is connected to one another, and the outer spiral metal wiring in the first planar spiral wiring is connected to the outer spiral metal wiring in the third planar spiral wiring such that the first and the third planar spiral wirings are configured in parallel and the second planar spiral wiring is configured in series with the first and the third planar spiral wirings configured in parallel.

2. The device of claim 1, further including:
   a first dielectric layer disposed between the semiconductor substrate and the first planar spiral wiring;
   a second dielectric layer disposed between the first planar spiral wiring and the second planar spiral wiring; and
   a third dielectric layer disposed between the second planar spiral wiring and the third planar spiral wiring.

3. The device of claim 1, further including:
   a first conductive plug connecting the one sub-metal-line of the at least two first sub-metal-lines in the first planar spiral wiring to the one sub-metal-line of the at least two sub-metal-lines in the second planar spiral wiring; and
   a second conductive plug connecting the one sub-metal-line of the at least two first sub-metal-lines in the second planar spiral wiring to the one sub-metal-line of the at least two sub-metal-lines in the third planar spiral wiring.

4. The device of claim 1, wherein the inner spiral metal wiring in the first, the second, or the third planar spiral wiring includes about 2 to about 10 isolated sub-metal-lines.

5. The device of claim 1, wherein the outer spiral metal wiring in the first, the second, or the third planar spiral wiring includes about 1 to about 10 isolated sub-metal-lines.

6. The device of claim 1, wherein a distance between adjacent sub-metal-lines in each of the first, the second, and the third planar spiral wirings is about 0.001 μm to about 100 μm.

7. The device of claim 1, wherein each sub-metal-line in the first, the second, and the third planar spiral wirings has a width of about 0.1 μm to about 100 μm.

8. The device of claim 1, wherein the first, the second, or the third planar spiral wiring is made of a material including copper or aluminum, and has a shape selected from a quadrilateral, hexagonal, octagonal or circular shape.

9. The device of claim 1, wherein the first, the second, or the third planar spiral wiring has a thickness of about 0.1 μm to about 100 μm, and an inner radius of about 5 μm to about 1 m.

10. The device of claim 1, wherein the outer spiral metal wiring in the first, the second, or the third planar spiral wiring is made by a single wire of copper and has a thickness of about 0.1 μm to about 100 μm.

11. The device of claim 1, wherein only an end of the at least two isolated sub-metal-lines of the inner spiral metal wiring is connected to the outer spiral metal wiring.

12. The device of claim 1, wherein, in each planar layer of the first, the second, and the third planar spiral wirings, the outer spiral metal wiring comprises a single conductive wire having a width greater than a width of any of the at least two isolated sub-metal-lines in each corresponding planar layer.

13. An inductor device comprising:
a semiconductor substrate;
a first planar spiral wiring disposed over the semiconductor substrate;
a second planar spiral wiring disposed over the first planar spiral wiring; and
a third planar spiral wiring disposed over the second planar spiral wiring,
wherein:
a first planar layer of the first planar spiral wiring includes an outer spiral metal wiring including at least two isolated sub-metal-lines, and surrounding an inner spiral metal wiring, such that the outer spiral metal wiring and the inner spiral metal wiring are connected in series, the outer spiral metal wiring in the first planar layer is connected to a first outer contact layer, and the inner spiral metal wiring in the first planar layer is connected to a first inner contact layer,
a second planar layer of the second planar spiral wiring includes an outer spiral metal wiring surrounding an inner spiral metal wiring including at least two isolated sub-metal-lines, such that the outer spiral metal wiring and the inner spiral metal wiring are connected in series, an inner sub-metal line of the inner spiral metal wiring in the second planar layer is connected to a second inner contact layer, and an outer sub-metal line of the inner spiral metal wiring is connected to a second outer contact layer, and
a third planar layer of the third planar spiral wiring includes an outer spiral metal wiring including at least two isolated sub-metal-lines, and surrounding an inner spiral metal wiring, such that the outer spiral metal wiring and the inner spiral metal wiring are connected in series, the outer spiral metal wiring in the third planar layer is connected to a third outer contact layer, and the inner spiral metal wiring in the third planar layer is connected to a third inner contact layer, wherein:
the first outer contact layer in the first planar layer, the second inner contact layer in the second planar layer, and the third outer contact layer in the third planar layer are connected with one another by a first conductive plug, and
the first inner contact layer in the first planar layer, the second outer contact layer in the second planar layer, and the third inner contact layer in the third planar layer are connected with one another by a second conductive plug,
such that the first and the third planar spiral wirings are configured in parallel and the second planar spiral wiring is configured in series with the first and the third planar spiral wirings configured in parallel.

14. The device of claim 13, further including:
a first dielectric layer disposed between the semiconductor substrate and the first planar spiral wiring;
a second dielectric layer disposed between the first planar spiral wiring and the second planar spiral wiring; and
a third dielectric layer disposed between the second planar spiral wiring and the third planar spiral wiring.

15. The device of claim 13, wherein a distance between adjacent sub-metal-lines in each of the first, the second, and the third planar spiral wirings is about 0.001 μm to about 100 μm.

16. The device of claim 13, wherein each sub-metal-line in the first, the second, and the third planar spiral wirings has a width of about 0.1 μm to about 100 μm.

17. The device of claim 13, wherein the first, the second, or the third planar spiral wiring is made of a material including copper or aluminum, and has a shape selected from a quadrilateral, hexagonal, octagonal or circular shape.

18. The device of claim 13, wherein the first, the second, or the third planar spiral wiring has a thickness of about 0.1 μm to about 100 μm, and an inner radius of about 5 μm to about 1 m.

* * * * *